(12) United States Patent
Zhu et al.

(10) Patent No.: US 10,727,054 B2
(45) Date of Patent: Jul. 28, 2020

(54) NITRIDE-BASED SEMICONDUCTOR DEVICE AND METHOD FOR PREPARING THE SAME

(71) Applicant: XIAMEN SAN'AN OPTOELECTRONICS CO., LTD., Xiamen (CN)

(72) Inventors: Xueliang Zhu, Xiamen (CN); Jianming Liu, Xiamen (CN); Chang-Cheng Chuo, Xiamen (CN); Bing-Yang Chen, Xiamen (CN); Chen-ke Hsu, Xiamen (CN); Chung-Ying Chang, Xiamen (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 16/447,775

(22) Filed: Jun. 20, 2019

(65) Prior Publication Data
US 2019/0304781 A1 Oct. 3, 2019

Related U.S. Application Data

(63) Continuation-in-part of application No. PCT/CN2018/078653, filed on Mar. 12, 2018.

(30) Foreign Application Priority Data

Apr. 5, 2017 (CN) .......................... 2017 1 0221821

(51) Int. Cl.
*H01L 21/00* (2006.01)
*H01L 33/00* (2010.01)
(Continued)

(52) U.S. Cl.
CPC .... *H01L 21/02658* (2013.01); *H01L 21/0243* (2013.01); *H01L 21/0254* (2013.01);
(Continued)

(58) Field of Classification Search
CPC ........... H01L 21/02658; H01L 21/0243; H01L 21/02458; H01L 21/0254; H01L 21/0262;
(Continued)

(56) References Cited

U.S. PATENT DOCUMENTS 6,091,083 A * 7/2000 Hata ................... H01L 33/007
257/190
6,657,236 B1 * 12/2003 Thibeault ................ H01L 33/20
257/81
(Continued)

FOREIGN PATENT DOCUMENTS

| CN | 101517759 A | 8/2009 |
|----|-------------|--------|
| CN | 106992231 A | 7/2017 |
| TW | 201310702 A1 | 3/2013 |

OTHER PUBLICATIONS

Williams at al., "Etch Rates for Micromachining Processing—Part II", 2003, Journal of Microelectromechanical Systems, vol. 12, No. 6, pp. 761-778, published Dec. 2003 (Year: 2003).*
(Continued)

*Primary Examiner* — Nikolay K Yushin
(74) *Attorney, Agent, or Firm* — DLA Piper LLP (US)

(57) ABSTRACT

A nitride-based semiconductor device includes a patterned substrate having an etched surface that is formed with a plurality of protrusions, an aluminum nitride (AlN)-based film disposed on the etched surface, and a nitride-based semiconductor stacked structure disposed on the aluminum nitride-based film. Each of the protrusions has a side face. The AlN-based film includes a plurality of crystal defects formed on the side face of each protrusion. Each of the
(Continued)

crystal defects has a width of smaller than 20 nm and/or the number of the crystal defects that are formed on the side face of each protrusion and that have a width of greater than 10 nm is less than 10. A method for preparing the semiconductor device is also disclosed.

19 Claims, 6 Drawing Sheets

(51) Int. Cl.
*H01L 21/02* (2006.01)
*H01L 33/22* (2010.01)
*H01L 33/32* (2010.01)
*H01L 33/02* (2010.01)

(52) U.S. Cl.
CPC .... *H01L 21/0262* (2013.01); *H01L 21/02458* (2013.01); *H01L 21/02631* (2013.01); *H01L 33/007* (2013.01); *H01L 33/0075* (2013.01); *H01L 33/025* (2013.01); *H01L 33/22* (2013.01); *H01L 33/32* (2013.01)

(58) Field of Classification Search
CPC ............. H01L 21/02631; H01L 33/007; H01L 33/0075; H01L 33/025; H01L 33/22; H01L 33/32
See application file for complete search history.

(56) References Cited

U.S. PATENT DOCUMENTS

| | | | |
|---|---|---|---|
| 7,683,386 B2* | 3/2010 | Tanaka | H01L 21/0237 257/88 |
| 8,314,436 B2* | 11/2012 | Shim | H01L 33/325 257/76 |
| 2005/0179130 A1* | 8/2005 | Tanaka | H01L 21/0237 257/730 |
| 2010/0213476 A1 | 8/2010 | Yokoyama et al. | |

OTHER PUBLICATIONS

Search Report issued to PCT application No. PCT/CN2018/078653 by the CNIPA dated Jun. 19, 2018.

* cited by examiner

NITRIDE-BASED SEMICONDUCTOR DEVICE AND METHOD FOR PREPARING THE SAME

CROSS-REFERENCE TO RELATED APPLICATION

This application is a bypass continuation-in-part application of PCT International Application No. PCT/CN2018/078653 filed on Mar. 12, 2018, which claims priority of Chinese Patent Application No. 201710221821.1, filed on Apr. 5, 2017. The entire content of each of the international and Chinese patent applications is incorporated herein by reference.

FIELD

The disclosure relates to a nitride-based semiconductor device and a method for preparing the same, and more particularly to a nitride-based semiconductor device with improved luminous efficiency and a method for preparing the same by virtue of plasma etching treatment to remove crystal defects.

BACKGROUND

Since gallium nitride (GaN)-based light-emitting diodes (LED) have high luminous efficiency, they have been widely applied in backlight, lightning, landscaping, etc. as a light source. Currently, the focus of LED industry is to further improve the luminous efficiency of LED chips. Generally, the luminous efficiency can be determined by the following factors: (1) electron-hole radiative recombination efficiency in an active region (also known as internal quantum efficiency); and (2) light extraction efficiency.

A blue LED material, such as gallium nitride (GaN)-based material, is conventionally formed on a sapphire substrate. However, the sapphire substrate and the GaN-based material have a great difference in the lattice, which may result in significant dislocation (i.e., crystallographic defect or irregularity) within the resultant epitaxial crystal structure, and the formation of non-radiative recombination centers, thereby reducing the internal quantum efficiency of the LED. In addition, since the GaN-based materials have a high refractive index, light emitted from the active region of LED would be totally internally reflected, thereby decreasing the light extraction efficiency.

A patterned sapphire substrate may ameliorate the above-mentioned deficiencies not only by effectively controlling the density of nucleation islands to improve the quality of the gallium nitride (GaN) crystal, but also by effectively scattering light emitted from the active region to suppress total internal reflection.

Figure 1:
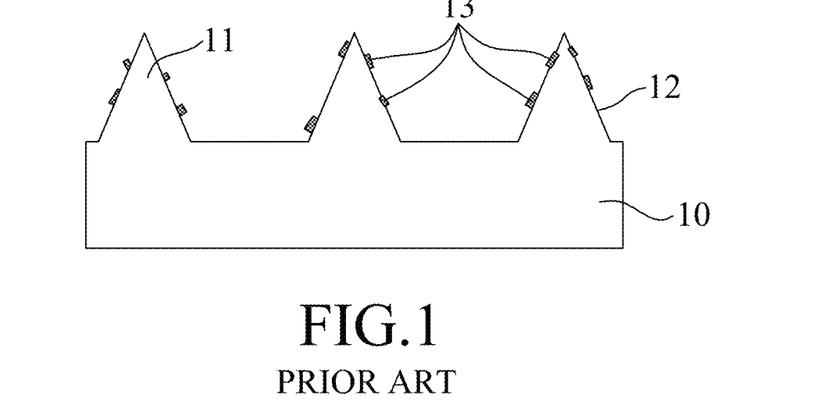
FIGS. 1 to 2 are schematic views illustrating the steps of a conventional method for preparing a nitride-based semiconductor device.
Figure 2:
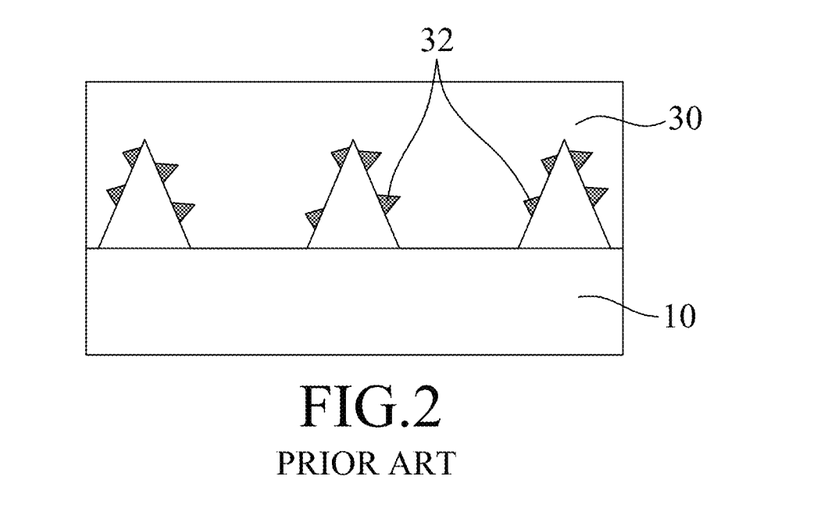
Figure 3:
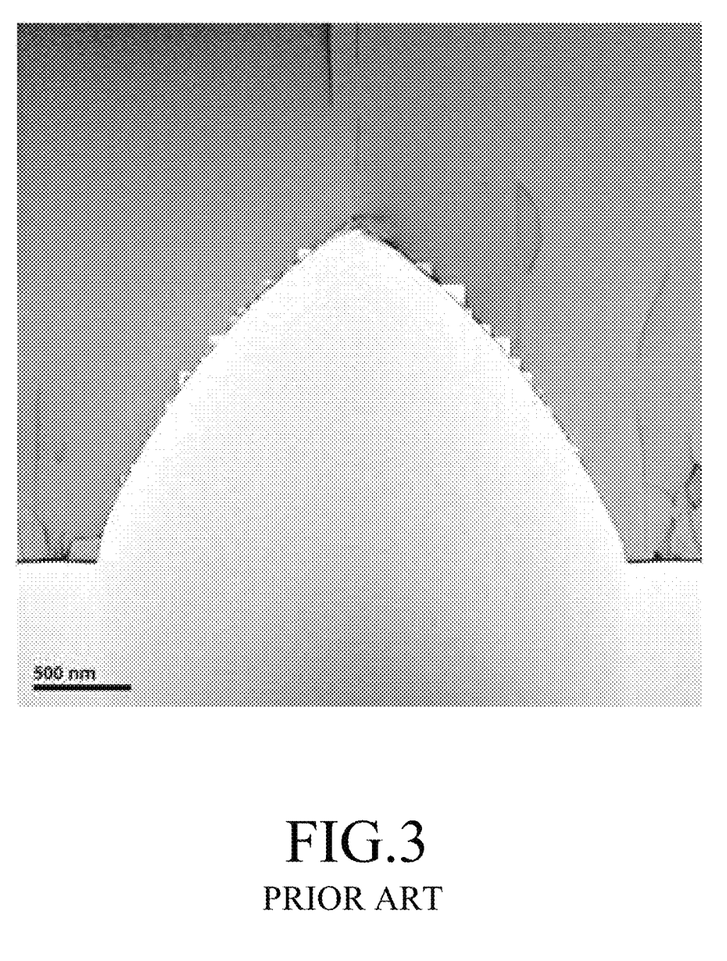
FIG. 3 is a transmission electron microscope (TEM) photograph showing the epitaxial configuration of the nitride-based semiconductor device prepared by the conventional method.

The patterned sapphire substrate is usually obtained by dry etching or wet etching the sapphire substrate. Referring to FIG. 1, in the dry etching, a substrate 10 is etched using physical bombardment to form a plurality of protrusions 11 (i.e., pattern), and the side walls 12 of the protrusions 11 may be damaged to form surface defects 13 (i.e., rough surface), which may lead to formation of crystal defects 32 in a subsequent step of epitaxial growth of an epitaxial staked structure 30 (as shown in FIGS. 2 and 3). Thus, the density of the defective epitaxial material is increased, which reduces internal quantum efficiency. Furthermore, the crystal defects 32 absorb light, thereby reducing light extraction efficiency.

Chinese Invention Patent Application Publication No. CN 104246980 A discloses that formation of an aluminum nitride (AlN) buffer layer between a substrate and an undoped and/or doped gallium nitride layer by physical vapor deposition (PVD) can improve the quality of the GaN crystal and the luminous efficiency of the resultant GaN-based light device.

However, there is still a need to provide a semiconductor device with high-quality epitaxial growth (i.e., less crystal defects) on a patterned substrate.

SUMMARY

Therefore, an object of the disclosure is to provide a nitride-based semiconductor device and a method for preparing the same that can alleviate at least one of the drawbacks of the prior art.

According to this disclosure, the nitride-based semiconductor device includes a patterned substrate, an aluminum nitride-based film and a nitride-based semiconductor stacked structure.

The patterned substrate has a patterned surface formed with a plurality of protrusions, and each of the protrusions has a side face. The aluminum nitride-based film is formed on the patterned surface of the patterned substrate to cover the protrusions, and includes a plurality of crystal defects formed on the side face of each of the protrusions. The nitride-based semiconductor stacked structure is disposed on the aluminum nitride-based film.

In certain embodiments, each of the crystal defects has a width of smaller than 20 nm. In other embodiments, the number of the crystal defects that are formed on the side face of each of the protrusions and that have a width of greater than 10 nm is less than 10.

According to the disclosure, the method includes the steps of:

(a) patterning a surface of a substrate so as to obtain a patterned substrate having a patterned surface formed with a plurality of protrusions, each of the protrusions having a side face;

(b) forming an aluminum nitride-based film on the patterned surface of the patterned substrate by physical vapor deposition (PVD) to cover the protrusions;

(c) forming a nitride-based semiconductor stacked structure on the aluminum nitride-based film by metal organic chemical-vapor deposition (MOCVD); and (d) before step (b) of forming the aluminum nitride-based film, plasma etching the patterned surface of the patterned substrate to remove surface defects of the patterned substrate on the side faces of the protrusions, or after step (b) of forming the aluminum nitride-based film, plasma etching the aluminum nitride-based film to remove crystal defects of the aluminum nitride-based film formed on the side faces of the protrusions so as to reduce defects of the nitride-based semiconductor device.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Further, in describing representative embodiments of the present disclosure, the method and/or process of the present disclosure may be presented as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present disclosure should not be limited to the performance of their steps in the order written, and one skilled in the art can readily appreciate that the sequences may be varied and still remain within the spirit and scope of the present invention.

Figure 4:
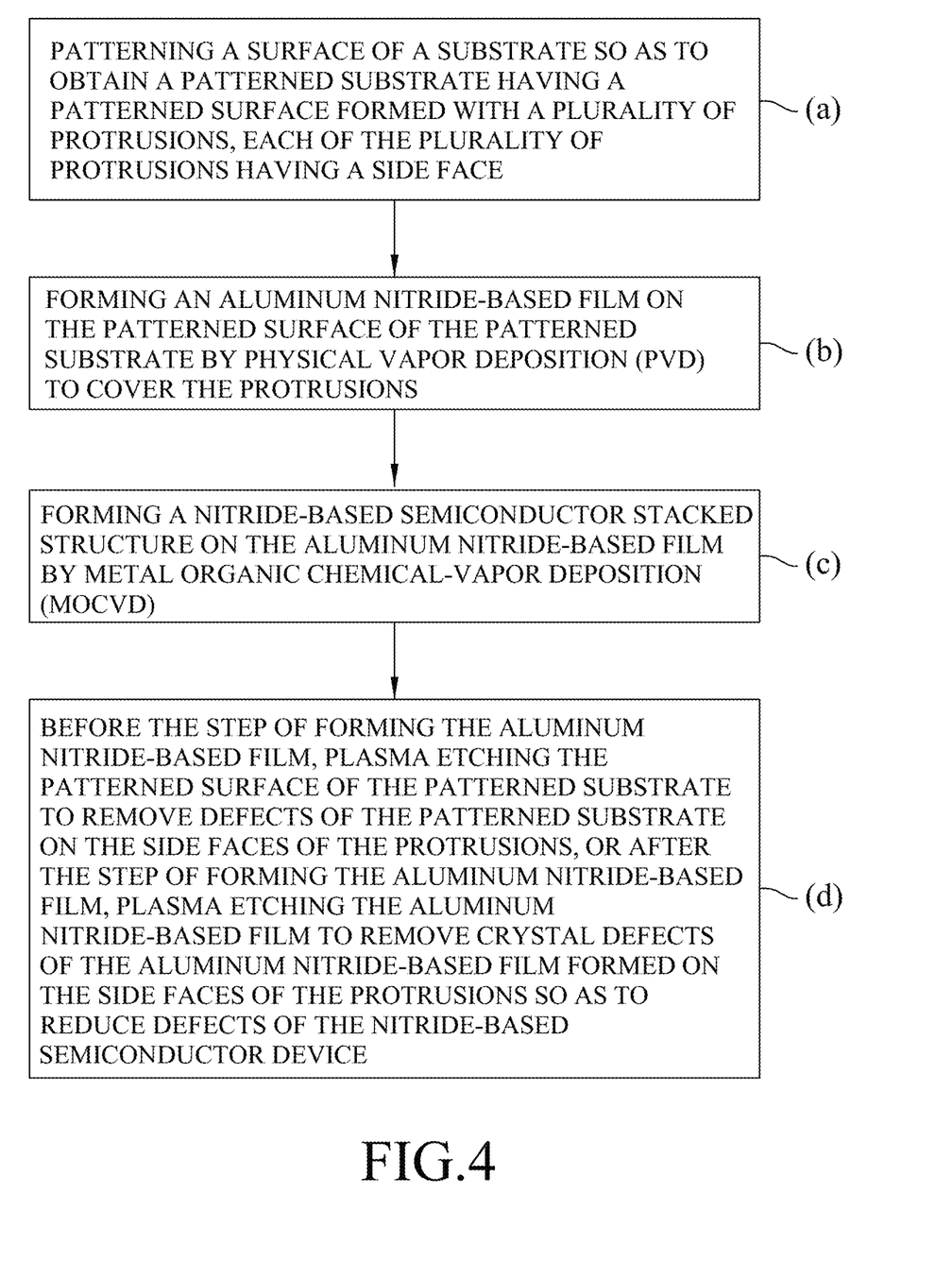
FIG. 4 is a flow chart illustrating an embodiment of a method for preparing a nitride-based semiconductor device according to the disclosure.

Referring to FIG. 4, an embodiment of a method for preparing a nitride-based semiconductor device (see FIG. 9) according to the disclosure includes the following steps (a) to (d).

Figure 5:
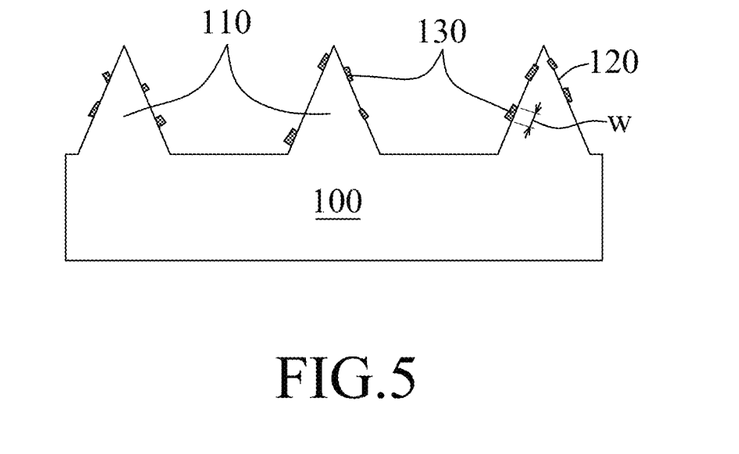
FIGS. 5 to 8 are schematic views illustrating the steps of the method of FIG. 4.

Steps (a): patterning a surface of a substrate so as to obtain a patterned substrate 100 having a patterned surface formed with a plurality of protrusions 110. Each of the protrusions 110 has a side face 120 (see FIG. 5). Step (a) may be conducted by dry etching, so that surface defects 130 may be formed on side faces 120 of the protrusions 110.

Examples of the substrate suitable for use in this disclosure may include, but are not limited to, a sapphire substrate, a silicon carbide (SiC)-based substrate, a gallium nitride (GaN)-based substrate, a silicon-based substrate, etc.

Figure 6:
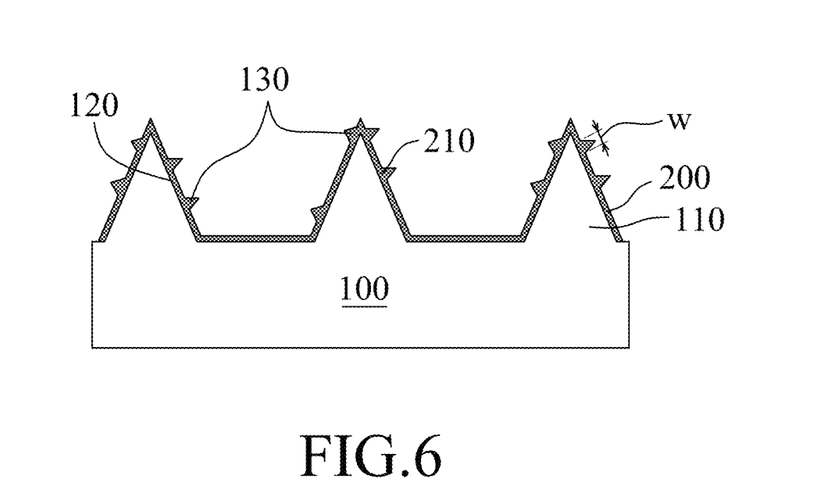

Step (b): forming an aluminum nitride-based film 200 on the patterned surface of the patterned substrate 100 by physical vapor deposition (PVD) to cover the protrusions 110 (see FIG. 6). The aluminum nitride-based film 200 includes a plurality of crystal defects 210 formed on the side face 120 of each of the protrusions 110. In certain embodiments, the AlN-based film is a $Al_xGa_{(1-x)}N$ film, in which $0<x\leq 1$.

Figure 8:
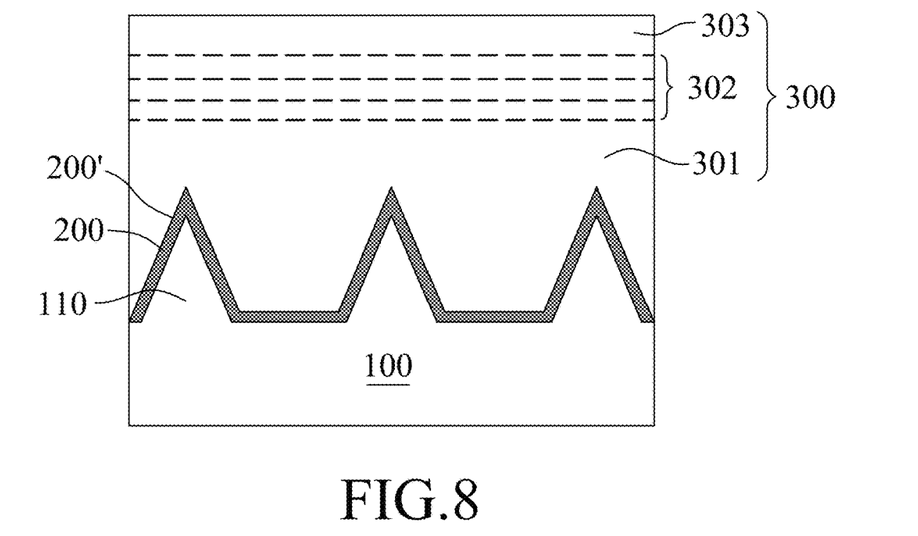

Step (c): forming a nitride-based semiconductor stacked structure 300 on the aluminum nitride-based film 200 by metal organic chemical-vapor deposition (MOCVD) (see FIG. 8). The nitride-based semiconductor 300 may include GaN-based material. In certain embodiments, the nitride-based semiconductor stacked structure 300 includes an n-type semiconductor layer 301, a light emitting layer 302 and a p-type semiconductor layer 303 which are sequentially arranged from bottom to top.

Figure 7:
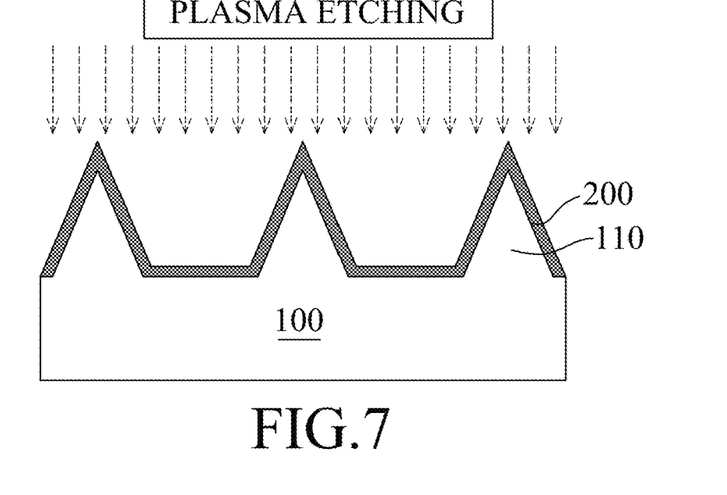

Step (d): before step (b) of forming the aluminum nitride-based film 200, plasma etching the patterned surface of the patterned substrate 100 to remove the surface defects 130 of the patterned substrate 100 on the side faces 120 of the protrusions 110, or after step (b) of forming the aluminum nitride-based film 200, plasma etching the aluminum nitride-based film 200 to remove crystal defects 210 of the aluminum nitride-based film 200 formed on the side faces 120 of the protrusions 110 so as to reduce defects of the nitride-based semiconductor device (see FIG. 7).

In certain embodiments, step (d) of plasma etching the patterned surface of the patterned substrate 100 is conducted before step (b) of forming the aluminum nitride-based film 200 so as to remove or reduce the surface defects 130 on the side faces 120 of the protrusions 110, thereby minimizing the crystal defects 210 of the aluminum nitride-based film 200.

In other embodiments, step (d) of plasma etching the aluminum nitride-based film 200 is conducted after step (b) of forming the aluminum nitride-based film so as to minimize the crystal defects 210 of the aluminum nitride-based film 200.

According to this disclosure, the method may further include the following steps, before step (c):

(e) forming an additional aluminum nitride-based film 200' on the aluminum nitride-based film 200 formed in step (b), followed by plasma etching the additional aluminum nitride-based film 200' to remove crystal defects of the additional aluminum nitride-based film 200'; and (f) repeating step (e) so as to form a plurality of the aluminum nitride-based films 200, 200' on the patterned substrate 100.

In certain embodiments, step (e) is repeatedly conducted 4 to 25 times. Each of the aluminum nitride-based films 200, 200' may independently have a thickness ranging from 1 nm to 5 nm. The aluminum nitride-based films 200, 200' (i.e., a laminate of the aluminum nitride-based films 200, 200') may have a total thickness ranging from 3 nm to 100 nm. Since multiple plasma etching treatments are conducted during the formation of the laminate of the aluminum nitride-based films 200, 200', the crystal defects 210 of the laminate of the aluminum nitride-based films 200, 200', which are formed on the side faces 120 of the protrusions 110 are greatly reduced. In certain embodiments, each of the crystal defects 210 of the laminate of the aluminum nitride-based films 200, 200' may have a width (W) of smaller than 20 nm. The number of the crystal defects 210 of the laminate of the aluminum nitride-based films 200, 200' that have a width (W) of greater than 10 nm may be less than 10.

The nitride-based semiconductor device thus obtained includes the patterned substrate 100 that has the patterned surface formed with the protrusions 110, each of the protrusions 110 having a side face 120; the aluminum nitride-based film 200 that is formed on the patterned surface of the patterned substrate 100 to cover the protrusions 110, and that includes the crystal defects 210 formed on the side face 120 of each of the protrusions 110; and the nitride-based semiconductor stacked structure 300 that is disposed on the aluminum nitride-based film 200.

By virtue of the plasma etching treatment(s), each of the crystal defects 210 that is formed on the side faces 120 of the protrusions 110 may have a width (W) of smaller than 20 nm. The number of the crystal defects 210 that have a width (W) of greater than 10 nm may be less than 10.

The disclosure will be further described by way of the following examples. However, it should be understood that the following examples are solely intended for the purpose of illustration and should not be construed as limiting the disclosure in practice.

EXAMPLES

Preparation of a Nitride-Based Semiconductor Device

A sapphire substrate was coated with a photoresist layer having a thickness ranging from 0.5 μm to 3 μm on a surface thereof. A pattern including a series of pillar portions was formed on the photoresist layer by photolithography, which may be conducted using, e.g., a stepper, a contact exposure apparatus, a projection exposure apparatus or an imprinter. Each of the pillar portions has a width ranging from 0.1 μm to 6 μm, and two adjacent ones of the pillar portions have a distance ranging from 0.1 μm to 6 μm therebetween. Afterward, the sapphire substrate was subjected to dry etching treatment (i.e., physical bombardment) to remove the areas not protected by the photoresist layer, so as to obtain a patterned substrate having a patterned surface and a plurality of protrusions that are formed on the patterned surface and that are corresponding in position to the pillar portions. Due to the damage caused by the physical bombardment, several surface defects were formed on side faces of the protrusions.

The patterned substrate was placed in a PVD device with a temperature being raised to between 300° C. and 800° C. Suitable PVD devices may include, but are not limited to Endura® II 300 mm system (commercially available from Applied Materials, Inc.), iTops A230 system (commercially available from NAURA Microelectronics Equipment Co., Ltd.) and other magnetron sputtering systems. Then, a flow containing nitrogen gas and/or argon gas was introduced into the PVD device and a radio frequency (RF) power was applied. The resultant plasma hits the patterned surface of the substrate in a direction perpendicular to the substrate for 5 seconds to 300 seconds, so as to reduce the surface defects formed on the side faces of the protrusions (i.e., a relatively smooth patterned surface was obtained).

Thereafter, the patterned substrate was placed in the PVD device, where nitrogen gas, argon gas and oxygen gas were introduced. After turning on a direct current (DC) power supply, a first $Al_xGa_{(1-x)}N$ film having a thickness ranging from 1 nm to 5 nm was grown and formed on the patterned surface of the patterned substrate using aluminum-containing target, $N_2$, and optionally gallium-containing target. The first $Al_xGa_{(1-x)}N$ film may include a plurality of crystal defects formed on the side face of each of the protrusions. The DC power supply was turn off and a RF power was applied, and a flow containing nitrogen gas and/or argon gas was introduced into the PVD device. The resultant plasma containing nitrogen ions and/or argon ions hits the deposited $Al_xGa_{(1-x)}N$ film (i.e., plasma cleaning) in a direction perpendicular to the patterned surface, so as to remove the crystal defects of the first $Al_xGa_{(1-x)}N$ film. An additional $Al_xGa_{(1-x)}N$ film was then deposited on the first $Al_xGa_{(1-x)}N$ film, and subjected to plasma etching treatment so as to remove the crystal defects of the additional $Al_xGa_{(1-x)}N$ film. By repeating the abovementioned processes (i.e., depositing the additional $Al_xGa_{(1-x)}N$ film, followed by plasma etching the additional $Al_xGa_{(1-x)}N$ film) several times, an $Al_xGa_{(1-x)}N$ laminate composed of these $Al_xGa_{(1-x)}N$ films and having a thickness ranging from 3 nm to 100 nm was obtained.

Afterward, in order to form a nitride-based semiconductor stacked structure, such as light-emitting diode (LED) in this example, on the $Al_xGa_{(1-x)}N$ laminate, metal organic chemical-vapor deposition (MOCVD) was applied, in which trimethyl indium, trimethyl gallium, and ammonia were respectively used as gallium (Ga), indium (In), and nitrogen (N) sources. Methylsilane and magnesocene were respectively used as the n-dopant and p-dopant sources. Hydrogen was used as the carrier gas for the growth of the GaN layer while nitrogen was used as the carrier gas for the growth of the InGaN layer.

To be specific, the patterned substrate 100 grown with the $Al_xGa_{1-x}N$ laminate was heated to a temperature ranging from 500° C. to 1200° C. in a reaction chamber of a MOCVD apparatus, and then treated with a gas mixture including hydrogen gas, nitrogen gas and ammonia. The temperature of the reaction chamber was then set to be within 500° C. and 1050° C., and ammonia and trimethyl gallium were introduced into the reaction chamber of MOCVD apparatus, so that a buffer layer having a thickness ranging from 20 nm to 50 nm was grown on the $Al_xGa_{1-x}N$ laminate. The supply of trimethyl gallium was then stopped, and the reaction chamber was heated to a temperature ranging from 1000° C. to 1100° C., followed by conducting an annealing treatment for a time period ranging from 1 minute to 5 minutes. Trimethyl gallium was further introduced into the reaction chamber of MOCVD apparatus so as to form a first undoped GaN layer having a thickness ranging from 1 μm to 2 μm. The reaction chamber was then heated to a temperature ranging from 1050° C. to 1150° C., so that a second undoped GaN layer having a thickness ranging from 1 μm to 2 μm was formed. Subsequently, the reaction chamber was cooled to a temperature ranging from 1030° C. to 1120° C. to grow a GaN layer having a thickness ranging from 1.5 μm to 4 μm, followed by a doping treatment using methylsilane as a n-dopant, so as to from a n-type GaN layer. After cooling the reaction chamber to a temperature ranging from 770° C. to 870° C. and introducing trimethyl indium and trimethyl gallium, an InGaN/GaN superlattice system with periods ranging between 15 and 30 was grown, in each periodicity, the InGaN layer having a thickness ranging from 1 μm to 3 μm and the GaN layer having a thickness ranging from 2 μm to 10 μm. The temperature of the reaction chamber was set to be within 750° C. and 900° C., and an InGaN/GaN multiple quantum wells (MQWs) system with periods ranging between 5 and 15 was formed on the InGaN/GaN superlattice system. After lowering the temperature of the reaction chamber to a range from 730° C. to 800° C. and introducing trimethyl indium, trimethyl gallium, and trimethyl aluminum, a p-type AlInGaN layer that serves as a hole injection layer and that has a thickness ranging from 20 nm to 80 nm was deposited on the InGaN/GaN multiple quantum wells (MQWs) system. The temperature of the reaction chamber was raised to a range from 900° C. to 1000° C., and alternately-stacked AlGaN/GaN layers were grown, followed by a doping treatment using magnesocene, so as to form p-type AlGaN/GaN layers. Thereafter, a GaN layer was formed at a temperature ranging between 900° C. and 1000° C., followed by a doping treatment using magnesocene, so as to form a p-type GaN layer, thereby obtaining the nitride-based semiconductor stacked structure (i.e., the LED). The transmission electron microscope (TEM) photograph of the epitaxial configuration of the LED obtained by the abovementioned method was shown in FIG. 9.

For comparison, a nitride-based LED of a comparative example was prepared by the conventional method, which was similar to the method of this example, except that no plasma etching treatment was conducted to remove the abovementioned surface defects and/or crystal defects. The epitaxial configuration of the LED of the comparative example was shown in FIG. 3.

It can be seen in FIG. 3 that the LED of the comparative example has several crystal defects formed on the side faces of the protrusions of the patterned substrate, in which the width of the crystal defects 32 generally ranges between 20 nm to 100 nm, and the number of the crystal defects that are formed on the side face of each protrusion and that have a width of greater than 10 nm is more than fifteen.

Figure 9:
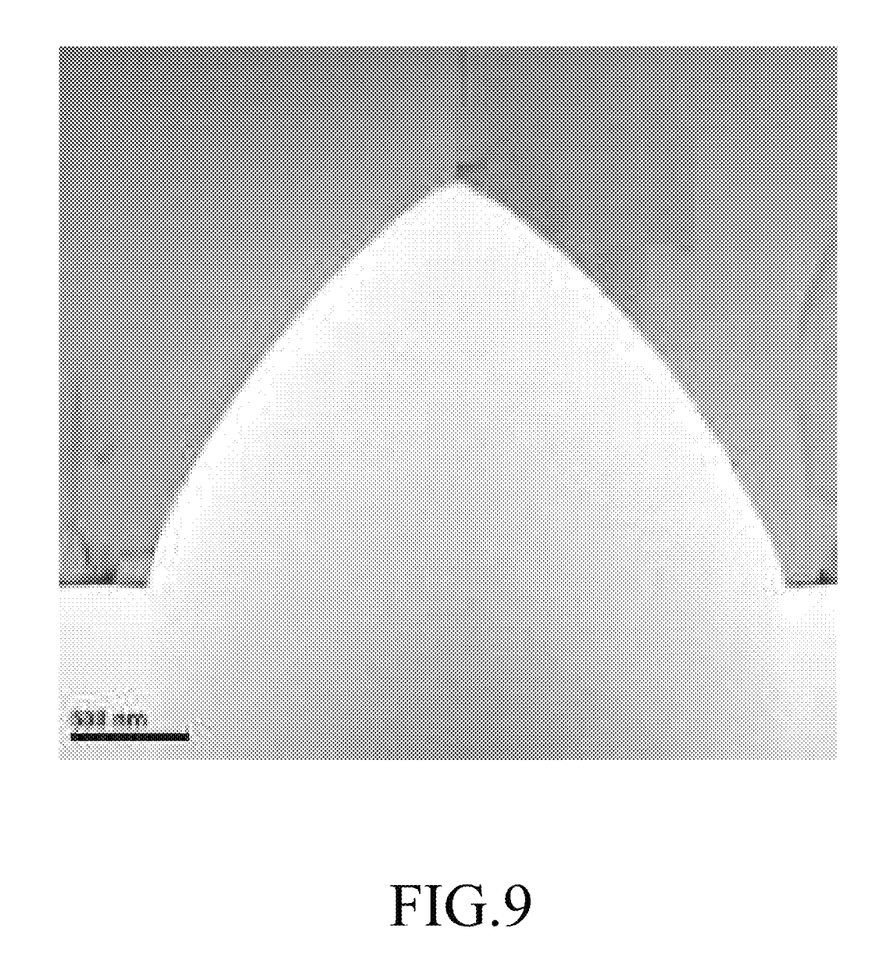
FIG. 9 is a TEM photograph showing the epitaxial configuration of the nitride-based semiconductor device of this disclosure with reduced crystal defects.

In contrast, FIG. 9 shows that the LED of this example prepared by the method of this disclosure (i.e., conducting the plasma etching treatment before and/or after the formation of the AlN-based film) has reduced crystal defects formed on the side face of each of the protrusions. That is, the crystal defects having a relatively larger width could be substantially removed or prevented by virtue of the plasma etching treatment. In this example, each of the crystal defects formed on side faces of the protrusions has a width of smaller than 20 nm, or even smaller than 10 nm. Moreover, the number of the crystal defects that are formed on the side face of each protrusion and that have a width of greater than 10 nm is less than ten. With such configuration, the luminance of the nitride-based semiconductor device (e.g., LED device) of this disclosure may be enhanced by 2% or more, e.g., 3% to 5% as compared to the nitride-based semiconductor device of the comparative example.

In summary, by virtue of conducting the plasma etching treatment before and/or after the formation of the AlN-based film on the patterned substrate, the method of this disclosure can be used for preparing a nitride semiconductor device having reduced crystal defects (i.e., improved crystalline quality) and thus preventing reduced light absorption caused by the crystal defects, thereby exhibiting improved luminous efficiency.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A nitride-based semiconductor device, comprising:
   a patterned substrate that has a patterned surface formed with a plurality of protrusions, each of said protrusions having a side face;
   an aluminum nitride-based laminate that is formed on said patterned surface of said patterned substrate to cover said protrusions, and that includes a plurality of aluminum nitride-based films and a plurality of crystal defects formed on said side face of each of said protrusions; and
   a nitride-based semiconductor stacked structure that is disposed on said aluminum nitride-based laminate,
   wherein during formation of each of the aluminum nitride-based films, plasma etching is conducted to remove crystal defects formed thereon such that each of said crystal defects has a width of smaller than 20 nm.

2. The nitride-based semiconductor device as claimed in claim 1, wherein the number of said crystal defects that are formed on said side face of each of said protrusions and that have a width of greater than 10 nm is less than 10.

3. The nitride-based semiconductor device as claimed in claim 1, wherein each of said aluminum nitride-based films is a $Al_xGa_{(1-x)}N$ film, in which $0<x\leq1$.

4. The nitride-based semiconductor device as claimed in claim 1, wherein said aluminum nitride-based laminate has a thickness ranging from 3 nm to 100 nm.

5. The nitride-based semiconductor device as claimed in claim 1, wherein said nitride-based semiconductor stacked structure includes gallium nitride-based material.

6. The nitride-based semiconductor device as claimed in claim 1, wherein said nitride-based semiconductor stacked structure includes an n-type semiconductor layer, a light emitting layer and a p-type semiconductor layer.

7. A nitride-based semiconductor device, comprising:
   a patterned substrate that has a patterned surface formed with a plurality of protrusions, each of said protrusions having a side face;
   an aluminum nitride-based laminate that is formed on said patterned surface of said patterned substrate to cover said protrusions, and that includes a plurality of aluminum nitride-based films and a plurality of crystal defects formed on said side face of each of said protrusions; and
   a nitride-based semiconductor stacked structure that is disposed on said aluminum nitride-based laminate,
   wherein during formation of each of the aluminum nitride-based films, plasma etching is conducted to remove crystal defects formed thereon such that the number of said crystal defects formed on said side wall of each of said protrusions and having a width of greater than 10 nm is less than 10.

8. The nitride-based semiconductor device as claimed in claim 7, wherein each of said aluminum nitride-based films is a $Al_xGa_{(1-x)}N$-based film, in which $0<x\leq1$.

9. The nitride-based semiconductor device as claimed in claim 7, wherein said aluminum nitride-based laminate has a thickness ranging from 3 nm to 100 nm.

10. The nitride-based semiconductor device as claimed in claim 7, wherein said nitride-based semiconductor stacked structure includes gallium nitride-based material.

11. The nitride-based semiconductor device as claimed in claim 7, wherein said nitride-based semiconductor stacked structure includes an n-type semiconductor layer, a light emitting layer and a p-type semiconductor layer.

12. A method for preparing a nitride-based semiconductor device, comprising the steps of:
   (a) patterning a surface of a substrate so as to obtain a patterned substrate having a patterned surface formed with a plurality of protrusions, each of the protrusions having a side face;

(b) forming an aluminum nitride-based film on the patterned surface of the patterned substrate by physical vapor deposition (PVD) to cover the protrusions;

(c) forming a nitride-based semiconductor stacked structure on the aluminum nitride-based film by metal organic chemical-vapor deposition (MOCVD); and (d) after step (b) of forming the aluminum nitride-based film, plasma etching the aluminum nitride-based film to remove crystal defects of the aluminum nitride-based film formed on the side faces of the protrusions so as to reduce defects of the nitride-based semiconductor device;

wherein the method further comprises, before step (c):

(e) forming an additional aluminum nitride-based film on the aluminum nitride-based film formed in step (b), followed by plasma etching the additional aluminum nitride-based film to remove crystal defects of the additional aluminum nitride-based film; and (f) repeating step (e) so as to form a plurality of the aluminum nitride-based films on the patterned substrate.

13. The method as claimed in claim 12, wherein, to reduce defects of the nitride-based semiconductor device, the method further comprises plasma etching the patterned surface of the patterned substrate before step (b) of forming the aluminum nitride-based film.

14. The method as claimed in claim 12, wherein each of the aluminum nitride-based films independently has a thickness ranging from 1 nm to 5 nm, and the aluminum nitride-based films have a total thickness ranging from 3 nm to 100 nm.

15. The method as claimed in claim 12, wherein each of the aluminum nitride-based films is a $Al_xGa_{(1-x)}N$-based film, in which $0<x\le1$.

16. The method as claimed in claim 12, wherein the aluminum nitride-based films include a plurality of crystal defects formed on the side face of each of the protrusions, each of the crystal defects having a width of smaller than 20 nm.

17. The method as claimed in claim 12, wherein the aluminum nitride-based films include a plurality of crystal defects formed on the side face of each of the protrusions, the number of the crystal defects that have a width of greater than 10 nm being less than 10.

18. The method as claimed in claim 12, wherein the nitride-based semiconductor stacked structure includes an n-type semiconductor layer, a light emitting layer and a p-type semiconductor layer.

19. The method as claimed in claim 12, wherein said nitride-based semiconductor stacked structure includes gallium nitride-based material.

* * * * *